(12) United States Patent
Kang

(10) Patent No.: US 6,211,725 B1
(45) Date of Patent: Apr. 3, 2001

(54) LOW POWDER CMOS CIRCUIT

(75) Inventor: Dae Gwan Kang, Chungcheongbuk-do (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/182,656

(22) Filed: Oct. 30, 1998

(30) Foreign Application Priority Data

Jan. 13, 1998 (KR) .................................................. 98-734

(51) Int. Cl.[7] ............................................................ H03K 3/01

(52) U.S. Cl. ............................ 327/534; 327/537; 326/112

(58) Field of Search ................................... 327/534, 537; 326/112, 119, 121

(56) References Cited

U.S. PATENT DOCUMENTS 5,892,260 * 4/1999 Okumura et al. ..................... 257/347
5,909,140 * 6/1999 Choi ...................................... 327/534

OTHER PUBLICATIONS

Mutoh, S. et al., "1–V Power Supply High–Speed Digital Circuit Technology with Multithreshold–Voltage CMOS", *IEEE Journal of Solid–State Circuits*, vol. 30, No. 8, pp. 847–854, 1995.
Kuroda, T. et al., "A 0.9V 150MHz 10mW 4mm² –D Discrete Cosine Transform Core Processor with Variable–Threshold–Voltage Scheme", 1996 IEEE International Solid–State Circuits Conference, vol. 39, pp. 166–168, 1996.

* cited by examiner

*Primary Examiner*—Terry D. Cunningham
*Assistant Examiner*—Quan Tra
(74) *Attorney, Agent, or Firm*—Morgan, Lewis & Bockius LLP

(57) ABSTRACT

Low power CMOS circuit provided with CMOS devices, is disclosed, for minimizing a power consumption in a standby mode, including PMOS transistors having drains connected to a power supply voltage and NMOS transistors having sources connected to a ground voltage, both of the PMOS transistors and the NMOS transistors being adapted to be applied of a back bias voltage in a standby mode, wherein the PMOS transistors and the NMOS transistors are formed to have high gamma factors.

4 Claims, 4 Drawing Sheets

LOW POWDER CMOS CIRCUIT

BACKGROUND OF THE INVENTION

1. Field of the Invention

The present invention relates to a CMOS circuit, and more particularly, to a low power CMOS circuit which is operable at a low power and has a low power consumption at standby.

2. Discussion of the Related Art

It is current trend that device sizes are in general scaled down for improving speeds, and a portable system operable on a battery requires both a low power and a high performance. In view of heat emission, the low power is increasingly considered important even in a mainframe design in which the performance has been considered the most important.

A gate delay(τpd) of an invertor can be expressed by the following equation (1).

$$\tau_{pd} = C_L \cdot \frac{Vdd}{2Ion}$$

Where, $C_L$ denotes a load capacitance, Vdd denotes a power supply voltage, and Ion denotes a saturation current of an MOSFET.

A system power can be expressed by an equation (2) shown below.

$$a \cdot f \cdot C_L \cdot V^2 dd + Ioff \cdot Vdd + Isc \cdot f \cdot Vda,$$

where, the term "$a \cdot f \cdot C_L \cdot V^2 dd$" represents an active power in which "a" denotes a activity factor, "f" denotes a clock frequency. The term "Ioff·Vdd" represents a standby power consumed by the Ioff. The last term "Isc·f·Vda" represents a power from a short circuit current flowing when a PMOS and an NMOS in an invertor gate are at turned on on the same time, which is negligible when Vdd is low. As can be know from equation (2), lowering the power supply voltage Vdd is the most efficient way to reduce the power. However, the lowering of the supply power voltage to reduce the power causes a speed reduction, which leads to a lowered threshold voltage for compensating the speed reduction, that results in an increased standby power coming from an increased subthreshold leakage current. In order to reduce this standby power, either a device fabricating technique or a circuitry technique may be improved, in which a subthreshold current reduction circuit or an MTCMOS circuit or a well biasing circuit may be used.

A background art CMOS circuit will be explained with reference to the attached drawings.

Referring to FIG. 1, a background art MTCMOS (MultiThreshold CMOS) circuit is provided with transistors of high threshold voltages and transistors of low threshold voltages. The high threshold voltage is an absolute threshold voltage equal to or higher than 0.5V and the low threshold voltage is an absolute threshold voltage equal to or below 0.4V. Or, when there is a threshold voltage difference greater than 0.1V, the higher one may be called as a high threshold voltage and the lower one may be called as a low threshold voltage. In the transistors of high threshold voltage, there are a first PMOS transistor PM1 and a first NMOS transistor NM1. The first PMOS transistor PM1 has one terminal applied of the power supply voltage VDD, the other terminal connected to a virtual power supply voltage VDDV, and a gate terminal applied of a standby signal S1. The NMOS transistor NM1 has one terminal connected to a ground voltage, the other terminal connected to a virtual ground voltage GNDV, and a gate terminal connected to an inverted standby signal S2. The transistors of low threshold voltages are provided between the virtual power supply voltage VDDV line and the virtual ground voltage GNDV line. In the transistors of low threshold voltages, there are second, and third PMOS transistors PM2 and PM3 each having one terminal connected to the virtual power supply voltage line in common and connected in parallel for receiving signals S4, S5 different from each other, and second, and third NMOS transistors NM2 and NM3 connected in series between the other terminals, which are connected in common, of the second, and third PMOS transistors PM2 and PM3 and the virtual ground voltage line for receiving signals S4, S5 different from each other.

In an operation mode of the MTCMOS circuit, when a standby signal S1 at 'low' and an inverted standby signal S2 at 'high' are received, the first PMOS transistor PM1 and the first NMOS transistor NM1 are turned on, causing the virtual power supply voltage line and the virtual ground voltage line operative as actual power lines, with a reduction of a circuit resistance. On the contrary, in a standby mode, when a standby signal S1 at 'high' and an inverted standby signal S2 at 'low' are received, the first PMOS transistor PM1 of a high threshold voltage and the first NMOS transistor NM1 of a high threshold voltage are turned off, causing the virtual power supply voltage line VDDV and the virtual ground voltage line GNDV floated, so as to be operative by the power supply voltage and the ground voltage, without a leakage flow. The operation speed of the MTCMOS circuit and a power consumption in a standby mode of the MTCMOS circuit are dependent on widths and driving powers of the first PMOS transistor PM1 and the first NMOS transistor NM1.

Referring to FIG. 2, the well biasing circuit, provided with transistors of low threshold voltages, having low gamma factors including a fourth PMOS transistor PM4 and a fourth NMOS transistor NM4 connected in series between a power supply voltage VDD and a ground voltage VSS and adapted to be operative in response to a same signal S3 and each having a well adapted to receive a back bias voltage Vbs in a standby mode. In the aforementioned well biasing circuit, a well bias voltage is applied to the wells in a standby mode, to increase the threshold voltage, that reduces a standby power.

The aforementioned background art low power CMOS circuits have the following problems.

First, in the case of the MTCMOS circuit, because of the first, and second PMOS transistors of high threshold voltages, an operation route becomes complicated, a chip area is increased, and no data can be conserved during a standby mode.

Second, the well biasing circuit has a limitation in reducing a power consumption in a standby mode as the fourth NMOS transistor has an increase of a threshold voltage by 0.1V even if a −2V back bias voltage is applied thereto due to a low gamma factor, a coefficient representing an increase of a threshold voltage upon application of a back bias in an short channel device.

SUMMARY OF THE INVENTION

Accordingly, the present invention is directed to a low power CMOS circuit that substantially obviates one or more of the problems due to limitations and disadvantages of the related art.

An object of the present invention is to provide a low power CMOS circuit which can minimize a power consumption in a standby mode.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the low power CMOS circuit provided with CMOS device includes PMOS transistors having drains connected to a power supply voltage and NMOS transistors having sources connected to a ground voltage, both of the PMOS transistors and the NMOS transistors being adapted to be applied of a back bias voltage in a standby mode, wherein the PMOS transistors and the NMOS transistors are formed to have great gamma factors.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings. In the present invention, transistors of different gamma factors γ are used for obtaining threshold voltages the same with each other in case no back bias voltage is applied and for obtaining threshold voltages either different from each other or increased than before in case a back bias voltage is applied. The gamma(γ) factor denotes an extent of change of the threshold voltage Vth according to a back bias voltage Vbs applied to a substrate, which is expressed as follows.

First, a threshold voltage of a transistor with a long channel can be expressed as follows.

$$V_{th} = V_{fb} + 2\varphi_f + \frac{1}{Cox}\sqrt{2\varepsilon_s qNa(2\varphi_f + Vbs)}$$

-continued $$\gamma = \frac{\sqrt{2q\varepsilon_s Na}}{Cox}$$

Where, $V_{fb}$ denotes a flat band voltage, $\phi_f$ denotes a Fermi potential, $\varepsilon_s$ denotes a permittivity of the semiconductor, Cox denotes a gate capacitance, Na denotes a doping concentration, q denotes an electronic charge, and Vbs denotes a back bias voltage. The gamma factor is said to be high when the value is equal to, or greater than 0.5, and to be low when the value is equal to, or below 0.3.

Figure 1:
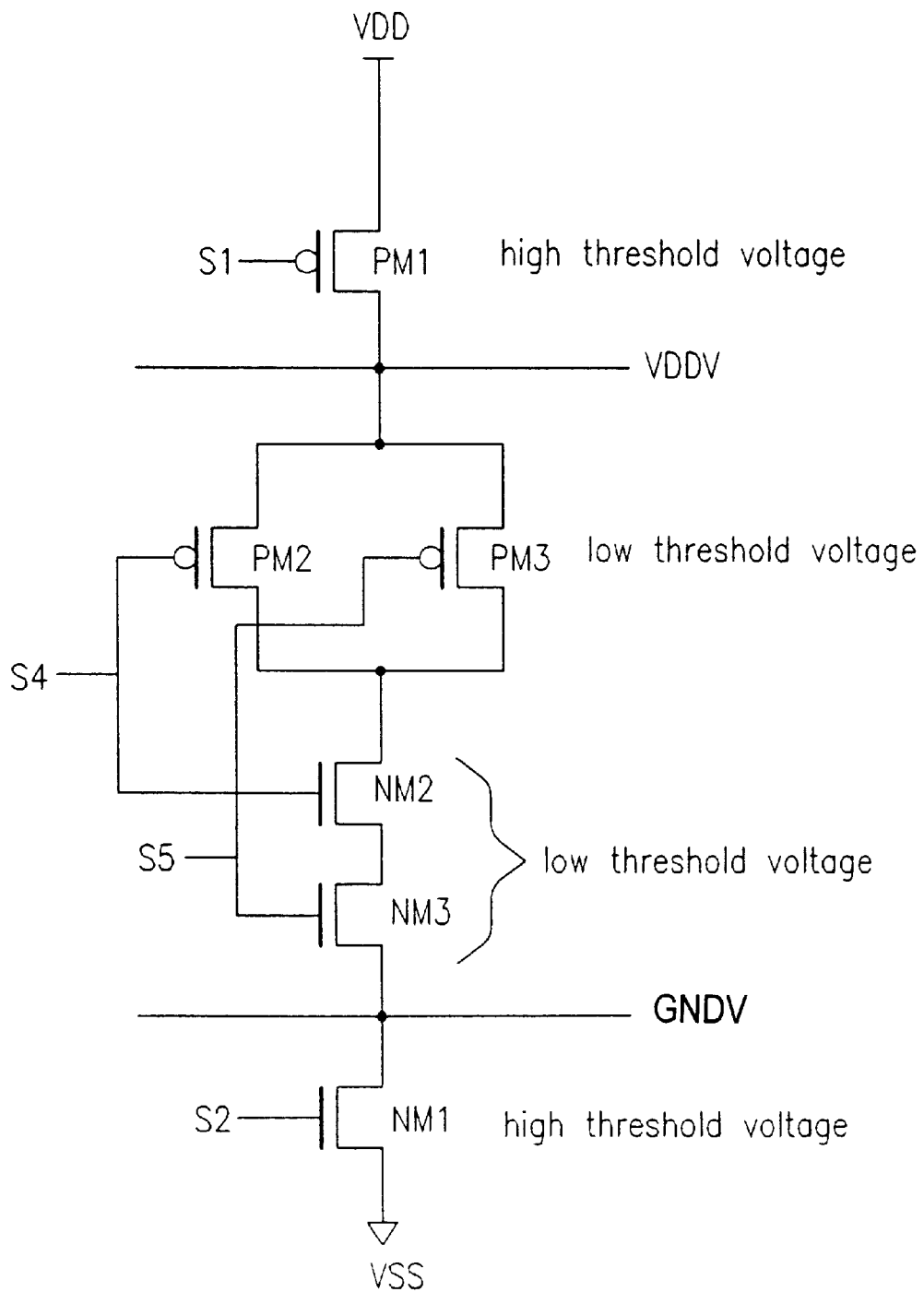
FIG. 1 illustrates a system of a background art MTCMOS circuit.
Figure 2:
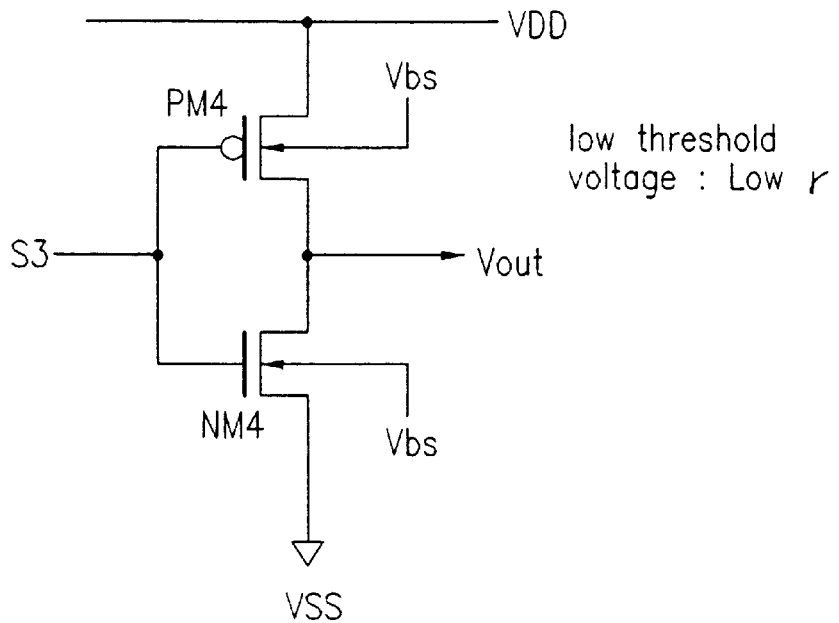
FIG. 2 illustrates a system of a background art well biasing circuit.
Figure 3:
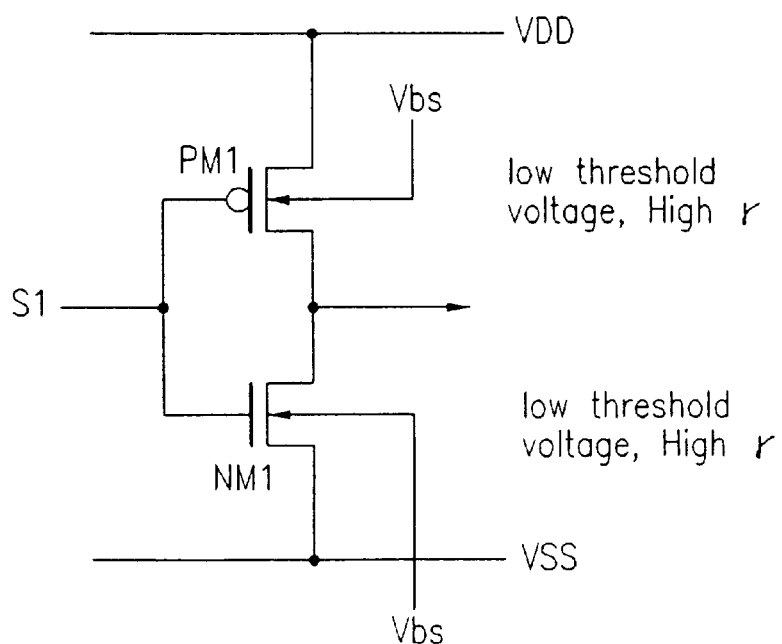
FIG. 3 illustrates a system of a CMOS invertor circuit having the present invention applied thereto.

Different circuits having the aforementioned subject matter of the present invention applied thereto will be explained with reference to the attached drawings. FIG. 3 illustrates a system of a CMOS invertor circuit having the present invention applied thereto, FIG. 4 illustrates a system of an NAND circuit having the present invention applied thereto, FIG. 5 illustrates a system of an NOR circuit having the present invention applied thereto, and FIG. 6 illustrates a system of an MTCMOS circuit having the present invention applied thereto.

Referring to FIG. 3, there is a CMOS invertor circuit including a first PMOS transistor PM1 and a first NMOS transistor NM1 connected in series between a power supply voltage VDD and a ground voltage VSS. Each of the first PMOS transistor PM1 and the first NMOS transistor NM1 is adapted to have a low threshold voltage when a back bias voltage Vbs is applied to a well thereof as well as a high gamma γ factor.

Figure 4:
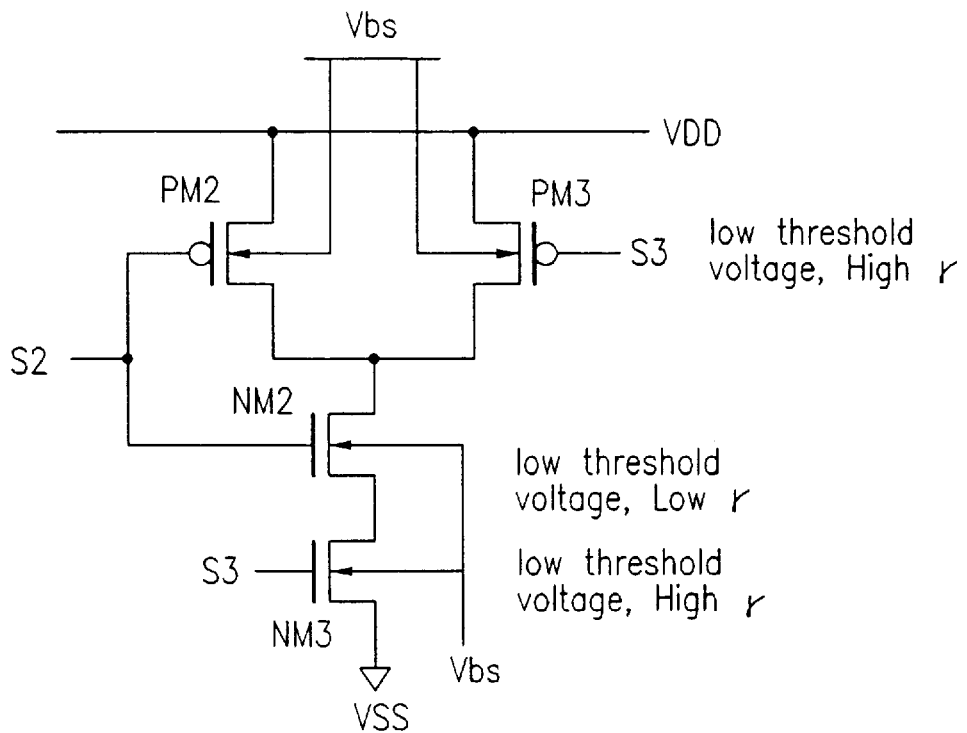
FIG. 4 illustrates a system of an NAND circuit having the present invention applied thereto.

Referring to FIG. 4, there is an NAND circuit including second, and third PMOS transistors PM2 and PM3 and second, and third NMOS transistors NM2 and NM3 connected in series between a power supply voltage VDD and a ground voltage VSS. The second, and third PMOS transistors have one terminals connected to the power supply voltage in common and the other terminals connected to the second NMOS transistor NM2 in common. And, the second NMOS transistor NM2 has one terminal connected to the third NMOS transistor NM3 in series, which third NMOS transistor NM3 has one terminal connected to a ground voltage. The second PMOS transistor and the second NMOS transistor are adapted to be operative in response to the same signal S2, and the third PMOS transistor and the third NMOS transistor are adapted to be operative in response to the same signal S3. In a standby mode, all the transistors in the NAND circuit become to have low threshold voltages when a back bias Vbs is applied to respective wells. And, the second, and third PMOS transistors PM2 and PM3, both of which are connected to the power supply voltage, and the second NMOS transistor NM3 connected to the ground voltage are adapted to have a high gamma γ factor respectively, except the second NMOS transistor which has a low gamma γ factor.

Figure 5:
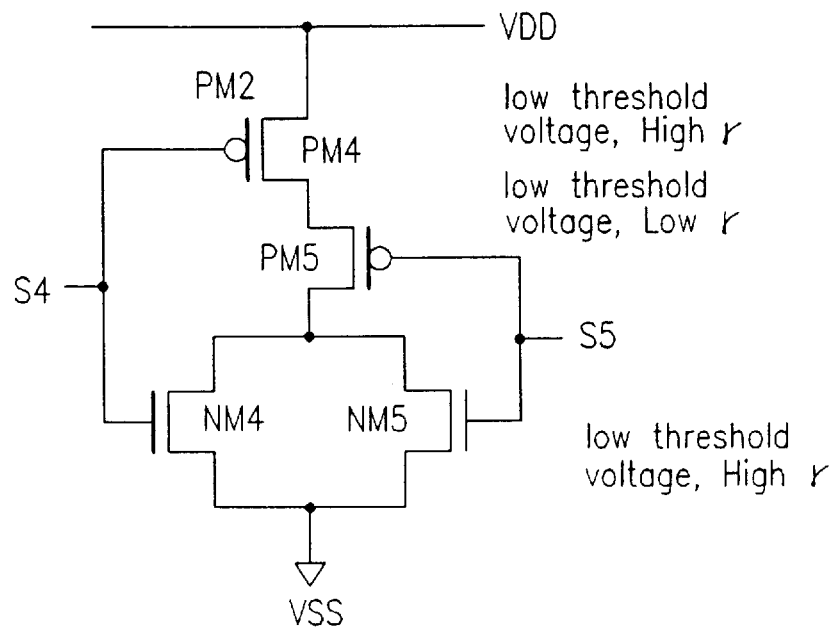
FIG. 5 illustrates a system of an NOR circuit having the present invention applied thereto; and, FIG. 6 illustrates a system of an MTCMOS circuit having the present invention applied thereto.
Figure 6:
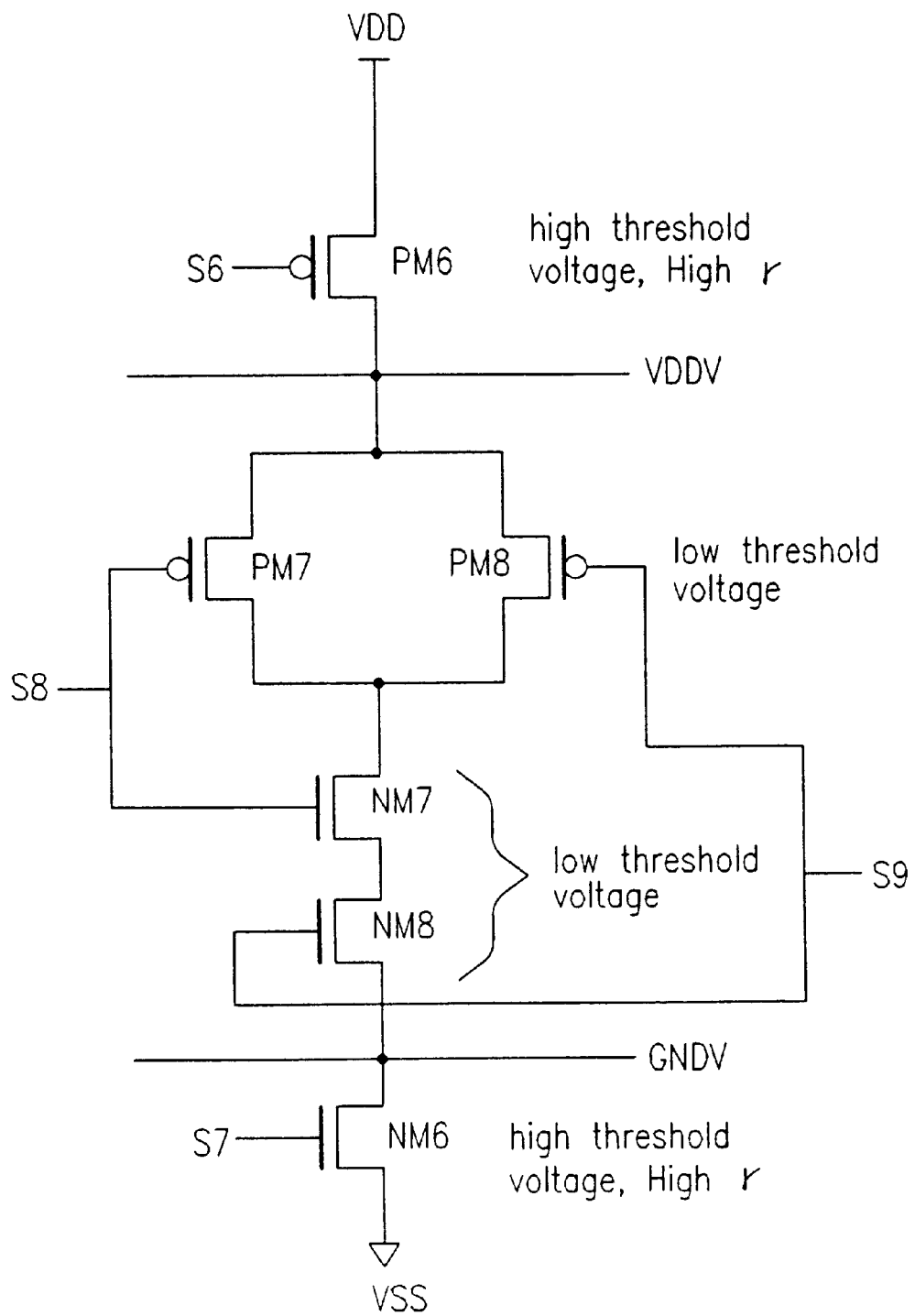

Referring to FIG. 5, a case when the subject matter of the present invention is applied to an NOR circuit will be explained. In the NOR circuit shown in FIG. 5, there are fourth, and fifth PMOS transistors PM4 and PM5 and fourth, and fifth NMOS transistors NM4 and NM5 connected between a power supply voltage and a ground voltage. The fourth PMOS transistor having one terminal connected to a power supply voltage is connected to the fifth PMOS transistor in series at one terminal thereof, and the fourth, and fifth NMOS transistors are connected in parallel between the other terminal of the fifth PMOS transistor and the ground voltage. The fourth PMOS transistor and the fourth NMOS transistor are adapted to be operative in response to the same signal S4, and the fifth PMOS transistor and the fifth NMOS transistor are adapted to be operative in response to the same signal S5. All the transistors in the NOR circuit are adapted to have low threshold voltages respectively, and the fourth PMOS transistor connected to the power supply voltage and the fourth, and fifth NMOS transistors, both connected to the ground voltage, are adapted to have low threshold voltages and high gamma factors, respectively, except the fifth PMOS transistor PM5 which is adapted to have a low gamma factor.

If the present invention is applied to an MTCMOS circuit, the MTCMOS circuit is to include transistors of high threshold voltages and transistors of low threshold voltages as shown in FIG. 6. In the transistors of high threshold voltages, there are a sixth PMOS transistor PM6 and a sixth NMOS transistor NM6. The sixth PMOS transistor PM6 has one terminal connected to a power supply voltage VDD, the other terminal connected to a virtual power supply voltage line VDDV, and a gate terminal adapted to be applied of a standby signal S6. The sixth NMOS transistor NM6 has one terminal connected to the ground voltage, the other terminal connected to a virtual ground voltage line GNDV, and a gate terminal connected to an inverted standby signal S7. And, the transistors of low threshold voltages are provided between the virtual power supply voltage line VDDV and the virtual ground voltage line GNDV. In the transistors of low threshold voltages, there are seventh, and eighth PMOS transistors PM7 and PM8 each having one terminal connected to the virtual power supply voltage line in common and connected in parallel for being operative in response to signals S8, S9 different from each other, and seventh, and eighth NMOS transistors NM7 and NM8 provided between a common terminal of the other terminals of the seventh, and eighth PMOS transistors PM 7 and PM8 and the virtual ground voltage and high gamma factors line and adapted to be operative in response to signals S8, S9 different from each other. The MTCMOS circuit is adapted to have a high gamma factor in a standby mode by applying a back bias voltage Vbs to the sixth PMOS transistor PM6 and the sixth NMOS transistor NM6, both of which have high threshold voltages, except the seventh, and eighth PMOS transistors and the seventh, eighth NMOS transistors which have low threshold voltages.

Transistors of different gamma factors may be obtained, by injecting halo ions in a fabrication of a transistor if a transistor of a low gamma factor is desired, and by injecting punch through stop ions in a fabrication of a transistor if a transistor of a high gamma factor is desired.

The operation of the aforementioned circuits will be explained.

In an operation mode, each of the transistors are turned on earlier as the threshold voltages are low, allowing the circuit operative faster. In the operation, even if the threshold voltages are increased by a back bias, the transistors with low gamma factors can not give much influence to the operation. The transistors with high gamma factors are not influenced from the back bias voltage. In a standby mode, upon application of a bias to wells, transistors with high gamma factors involved in increase of threshold voltages, with a reduction of a standby power. This is because the high gamma factors both of the PMOS transistor connected to power supply voltage and the NMOS transistor connected to a ground voltage prevent the transistors from being turned on when the back bias voltage is applied in the standby mode. Thus, a standby power in a standby mode is determined by transistors with high gamma factors.

The low power CMOS circuit of the present invention has the following advantage.

By providing transistors of different gamma factors depending on positions of the transistors in a circuit, a performance degradation of the circuit by a back bias can be minimized in an operation mode, and a standby power of the circuit can be reduced in a standby mode because the increase of the threshold voltages by application of the back bias voltage become the maximum in the standby mode, which leads a subthreshold current to flow to a minimum.

It will be apparent to those skilled in the art that various modifications and variations can be made in the low power CMOS circuit of the present invention without departing from the spirit or scope of the invention. Thus, it is intended that the present invention cover the modifications and variations of this invention provided they come within the scope of the appended claims and their equivalents.

What is claimed is:

1. A CMOS inverter circuit comprising:

a PMOS transistor having a gamma factor of at least 0.5 and having a source connected to a power supply voltage; and an NMOS transistor having a gamma factor of at least 0.5 and having a source connected to a ground voltage, wherein drains of the PMOS transistor and the NMOS transistor are connected together, wherein the gamma factor of the PMOS transistor is different from the gamma factor of the NMOS transistor, and wherein a back bias voltage is applied to both the PMOS transistor and the NMOS transistor in a standby mode for minimizing power consumption in the standby mode.

2. A CMOS NOR circuit comprising:

a first PMOS transistor having a gamma factor of at least 0.5 and having a source connected to a power supply voltage;

a second PMOS transistor having a gamma factor of no more than 0.3 and having a source connected to a drain of the first PMOS transistor; and first and second NMOS transistors having a gamma factor of at least 0.5 and having their sources connected to a ground voltage and their drains connected to a drain of the second PMOS transistor, wherein drains of the second PMOS transistor and the first and second NMOS transistors are connected together.

3. A CMOS NAND circuit comprising:

a first PMOS transistor having a gamma factor of at least 0.5 and having a source connected to a power supply voltage;

a second PMOS transistor having a gamma factor of at least 0.5 and having a source connected to the power supply voltage, wherein drains of the first PMOS transistor and the second PMOS transistor are connected together;

a first NMOS transistor having a gamma factor of at least 0.5 and having a source connected to a ground voltage; and a second NMOS transistor having a gamma factor of no more than 0.3 and having a source connected to a drain of the first NMOS transistor, and a drain connected to drains of the first and second PMOS transistors, wherein back bias voltage is applied to the first PMOS transistor, the second PMOS transistor, the first NMOS transistor and the second NMOS transistor in a standby mode for minimizing power consumption in the standby mode.

4. An MTCMOS circuit comprising:

a first PMOS transistor having a gamma factor of at least 0.5 and having a source connected to a power supply voltage;

a second PMOS transistor having a source connected to a drain of the first PMOS transistor;

a third PMOS transistor having a source connected to a drain of the first PMOS transistor;

a first NMOS transistor having a gamma factor of at least 0.5 and having a source connected to a ground voltage;

a second NMOS transistor having a source connected to a drain of the first NMOS transistor and a gate connected to a gate of the third PMOS transistor;

a third NMOS transistor having a source connected to a drain of the second NMOS transistor and a drain connected to drains of the second and third PMOS transistors, wherein a gate of the third NMOS transistor is connected to a gate of the second PMOS transistor, and wherein the gamma factor of the first PMOS transistor is different from the gamma factor of the first NMOS transistor.

* * * * *